(12) United States Patent
Sharda et al.

(10) Patent No.: US 9,476,937 B2
(45) Date of Patent: Oct. 25, 2016

(54) DEBUG CIRCUIT FOR AN INTEGRATED CIRCUIT

(71) Applicants: Garima Sharda, Ghaziabad (IN); Sunny Gupta, Noida (IN); Akshay K. Pathak, Noida (IN); Nidhi Sinha, Noida (IN)

(72) Inventors: Garima Sharda, Ghaziabad (IN); Sunny Gupta, Noida (IN); Akshay K. Pathak, Noida (IN); Nidhi Sinha, Noida (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 281 days.

(21) Appl. No.: 14/514,403

(22) Filed: Oct. 15, 2014

(65) Prior Publication Data

US 2016/0109515 A1    Apr. 21, 2016

(51) Int. Cl.
*G01R 31/317* (2006.01)

(52) U.S. Cl.
CPC .............................. *G01R 31/31705* (2013.01)

(58) Field of Classification Search
CPC ................................................ G01R 31/31705
See application file for complete search history.

(56) References Cited

U.S. PATENT DOCUMENTS

| | | |
|---|---|---|
| 6,502,209 B1 | 12/2002 | Bengtsson |
| 6,708,270 B1 | 3/2004 | Mayer |
| 8,423,845 B2 | 4/2013 | Hapke |

*Primary Examiner* — Bryce Bonzo
*Assistant Examiner* — Katherine Lin
(74) *Attorney, Agent, or Firm* — Charles E. Bergere

(57) ABSTRACT

An integrated circuit (IC) operable in functional and debug modes includes a debug enable circuit, a pad control register, a debug circuit, a pad configuration register, and an input/output (IO) pad. The debug circuit receives a functional signal from a circuit monitoring circuit, a reference signal, a debug control signal from the debug enable circuit, and pull-enable control and pull-type select control signals from the pad control register, and generates pull-enable and pull-type select signals. The pad configuration register receives the pull-enable and pull-type select signals and configures the IO pad in one of logic low, logic high, and high impedance states. When the IO pad is in either of the logic high and low states longer than a predetermined time period, then the IO pad indicates that the IC is held in a reset phase of a reset sequence.

20 Claims, 3 Drawing Sheets

DEBUG CIRCUIT FOR AN INTEGRATED CIRCUIT

BACKGROUND OF THE INVENTION

The present invention relates generally to integrated circuits, and, more particularly, to a method and circuit that allow debugging of an integrated circuit.

Integrated circuits (IC) include various analog and digital circuits such as operational amplifiers, voltage regulators, voltage monitoring circuits, sensors, logic circuits, and non-volatile memories. When an IC is powered on, these circuits are reset, i.e., set to corresponding predefined states. A predefined state refers to a known and stable state. To facilitate the reset of the circuits, the IC includes a power-on-reset (POR) generator and a reset controller. The POR generator generates a POR signal to initiate a reset sequence. During the reset sequence, the reset controller initializes the aforementioned circuits to corresponding predefined states.

Generally, the reset sequence includes multiple reset phases. For example, an IC may have four reset phases (first through fourth). In the first reset phase (also referred as a POR phase), circuits such as voltage regulator circuits and voltage monitor circuits are initialized. The IC transitions to the second reset phase from one of the first reset phase, the third reset phase, the fourth reset phase, or an idle phase. The second reset phase is referred to as a clock initialization phase during which a clock signal is initialized, i.e., the IC receives a predefined minimum number of clock cycles of the clock signal from a clock signal source. Subsequently, the IC transitions from the second reset phase to the third reset phase. In the third reset phase, a non-volatile memory such as a flash memory is initialized to a known state. Further, configuration information such as factory settings and boot code in the non-volatile memory are accessed by a processor of the IC during the third reset phase. The IC transitions to the fourth reset phase from either the third reset phase or the idle phase. In the fourth reset phase, the circuits perform self-tests and a few of the circuits fetch and execute code from the non-volatile memory based on user requirements.

During the reset sequence multiple circuits are initialized. If any circuit is not initialized to a known state during the corresponding reset phase, the IC may remain in the reset phase. In such a scenario, the processor is not released from the reset sequence and the IC hangs. For example, in the first reset phase, if a voltage monitor circuit does not receive a voltage supply at a desired voltage level, then it may not de-assert and the IC will remain in the first reset phase. Similarly, in the second reset phase, if the clock signal is inappropriately initialized, an internal clock monitor circuit of the IC may not generate a clock-ok signal so there would be a failure of the clock signal initialization, holding the IC in the second reset phase. If the memory is inappropriately initialized in the third reset phase, the IC will remain in the third reset phase. As a result, the IC will be unable to transition to functional mode. Therefore, it is necessary to be able to debug the IC when the IC is hung in one of the reset phases. Moreover, there is a need to determine in which reset phase of the reset sequence the IC is held, and the signals that have caused the IC to be hung in the reset phase.

Existing debug circuits are inadequate for debugging the IC during the reset sequence. Further, it is undesirable to include dedicated debugging input/output (IO) pins because that would increase area and cost. Also, increase in the number of dedicated debugging IO pins limits the number of IO pins available for functional purposes. Furthermore, when the IC is stuck in the reset phase, the processor may be unable to initiate debugging. Hence, the control of debugging must be available to a user.

Therefore, it would be advantageous to have an IC that includes a debug circuit for debugging the IC during a reset sequence.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
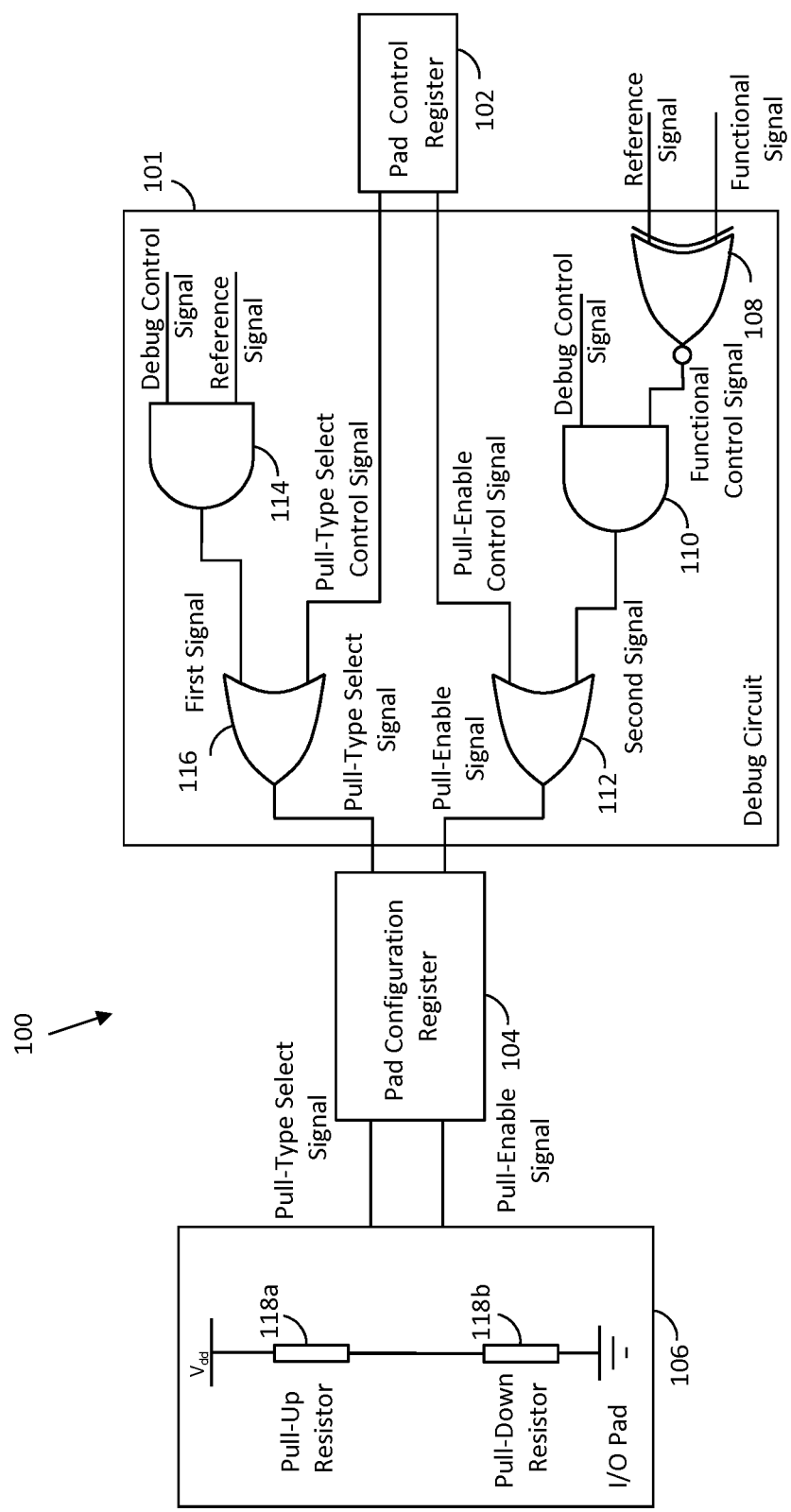
FIG. 1 is a schematic block diagram of an integrated circuit (IC) including a debug circuit in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention. As used herein, the term multiplexer has been abbreviated as a mux.

In an embodiment of the present invention, an integrated circuit operable in functional and debug modes and having an input/output (IO) pad is provided. The integrated circuit includes a pad control register, first through fifth logic gates, and a pad configuration register. The pad control register stores pull-type select control and pull-enable control bits and generates pull-type select control and pull-enable control signals when the integrated circuit is in the functional mode. The first logic gate has a first input terminal for receiving a debug control signal, a second input terminal for receiving a reference signal, and an output terminal for generating a first signal when the integrated circuit is in the debug mode. The second logic gate has a first input terminal connected to the output terminal of the first logic gate for receiving the first signal, a second input terminal connected to the pad control register for receiving the pull-type select control signal, and an output terminal for generating the first signal as a pull-type select signal when the integrated circuit is in the debug mode. The third logic gate has a first input terminal for receiving a functional signal of the integrated circuit, a second input terminal for receiving the reference signal, and an output terminal for generating a functional control signal when the integrated circuit is in the debug mode. The fourth logic gate has a first input terminal for receiving the debug control signal, a second input terminal connected to the output terminal of the third logic gate for receiving the functional control signal, and an output terminal for generating a second signal when the integrated circuit is in the debug mode. The fifth logic gate, has a first input terminal connected to the output terminal of the fourth logic gate for receiving the second signal, a second input terminal connected to the pad control register for receiving the pull-enable control signal, and an output terminal for generating the second signal as a pull-enable signal when the integrated circuit is in the debug mode. The pad configuration register is connected to the output terminals of the second and fifth logic gates for receiving the corresponding pull-type select and pull-enable signals and the IO pad for configuring the IO pad in at least one of logic high, logic low, and high impedance states when the integrated circuit is in the debug mode. The at least one of the logic high, logic low, and high impedance states of the IO pad indicate a state of the functional signal of the integrated circuit.

In another embodiment of the present invention, an integrated circuit operable in functional and debug modes and having an input/output (IO) pad is provided. The integrated circuit includes a multiplexer, a flip-flop, first through sixth logic gates, a pad control register, and a pad configuration register. The multiplexer has a first input terminal for receiving a feedback signal, a second input terminal for receiving a fuse signal, a select terminal for receiving a reset signal, and an output terminal for outputting at least one of the feedback and fuse signals when the integrated circuit is in the debug mode. The flip-flop has a first input terminal connected to the output terminal of the multiplexer for receiving at least one of the feedback and fuse signals, a second input terminal for receiving a power-on-reset signal, a clock input terminal for receiving a clock signal, and an output terminal for outputting at least one of the feedback and fuse signals when the integrated circuit is in the debug mode. The output terminal of the flip-flop is connected to the first input terminal the input terminal of the multiplexer. The first logic gate has a first input terminal connected to the output terminal of the flip-flop for receiving at least one of the feedback and fuse signals, a second input terminal for receiving the reset signal, a third input terminal for receiving a control signal, and an output terminal for generating a debug control signal when at least one of the feedback, fuse, reset, and control signals is at logic high state and the integrated circuit is in the debug mode. The pad control register stores pull-type select control and pull-enable control bits and generates pull-type select control and pull-enable control signals when the integrated circuit is in the functional mode. The second logic gate has a first input terminal connected to the output terminal of the first logic gate for receiving the debug control signal, a second input terminal for receiving a reference signal, and an output terminal for generating a first signal when the integrated circuit is in the debug mode. The third logic gate, having a first input terminal connected to the output terminal of the second logic gate for receiving the first signal, a second input terminal connected to the pad control register for receiving the pull-type select control signal, and an output terminal for generating the first signal as a pull-type select signal when the integrated circuit is in the debug mode. The fourth logic gate has a first input terminal for receiving a functional signal of the integrated circuit, a second input terminal for receiving the reference signal, and an output terminal for generating a functional control signal when the integrated circuit is in the debug mode. The fifth logic gate has a first input terminal for receiving the debug control signal, a second input terminal connected to the output terminal of the fourth logic gate for receiving the functional control signal, and an output terminal for generating a second signal when the integrated circuit is in the debug mode. The sixth logic gate has a first input terminal connected to the output terminal of the fifth logic gate for receiving the second signal, a second input terminal connected to the pad control register for receiving the pull-enable control signal, and an output terminal for generating the second signal as a pull-enable signal when the integrated circuit is in the debug mode. The pad configuration register is connected to the output terminals of the third and sixth logic gates for receiving the corresponding pull-type select and pull-enable signals and the IO pad for configuring the IO pad in at least one of logic high, logic low, and high impedance states when the integrated circuit is in the debug mode. The at least one of the logic high, logic low, and high impedance states of the IO pad indicate a state of the functional signal of the integrated circuit.

Various embodiments of the present invention provide an IC that is operable in functional and debug modes and has an IO pad. The IC includes a debug circuit, a debug enable circuit, a pad control register, and a pad configuration register. The IC is connected to circuits such as voltage monitor and regulator circuits and circuit monitoring circuits that generate functional signals to indicate the correct initialization of these circuits. The debug enable circuit receives a control signal indicating a debug mode of the IC, a reset signal and a fuse signal, and generates a debug control signal. The debug circuit receives the debug control signal from the debug enable circuit, pull-type select and pull-enable control signals from the pad control register, a reference signal, and a functional signal and generates pull-enable and pull-type select signals. The pad configuration register receives the pull-enable and pull-type select signals from the debug circuit and configures the IO pad in at least one of logic high, logic low, and high impedance states. The logic high, logic low, and high impedance states of the IO pad indicate a state of the functional signal. The high impedance state of the IO pad indicates that the functional signal is in a correct state, i.e., the circuits are correctly initialized. When the IO pad is in the logic high state or logic low state for a time period greater than a predetermined time period, the debug circuit indicates that the functional signal is in an incorrect state, i.e., the circuits are incorrectly initialized. The aforementioned debug mode corresponds to a reset phase of a reset sequence of the IC and the incorrect state of the functional signal indicates that the IC is held in the reset phase. The IO pad that is used along with the debug circuit to debug the IC is a general purpose IO pad (GPIO). The IC is debugged during the reset sequence of the IC by determining a logic state of the IO pad. The IO pad requires no redesigning for debugging the IC in the reset phase. Moreover, as additional IO pads are not required in the IC, the area and cost thereof does not increase.

Referring now to FIG. 1, an integrated circuit (IC) 100 including a debug circuit 101 in accordance with an embodiment of the present invention is shown. The IC 100 is operable in functional and debug modes. When the IC 100 is powered up, a power-on-reset (POR) generator of the IC 100 (not shown) generates a POR signal and the IC 100 transitions into a reset phase of a reset sequence. The reset sequence includes first through fourth reset phases.

The IC 100 includes multiple circuits such as voltage monitor and regulator circuits, and non-volatile memories (collectively not shown), that are initialized by a reset controller (explained in conjunction with FIG. 2) of the IC 100 during the reset phases of the reset sequence. Each circuit has a corresponding circuit monitoring circuit to monitor the correct initialization of the circuit. When the circuits are initialized during the corresponding reset phases, each monitoring circuit generates a functional signal to indicate a successful initialization thereof. In an example, when a non-volatile memory such as a flash memory (not shown) is initialized successfully, a flash memory monitoring circuit (not shown) of the IC 100 generates a memory initialization status signal (hereinafter referred to as a flash ready signal) as the functional signal at logic high state.

However, when one of the abovementioned circuits is inappropriately initialized in a corresponding reset phase, the IC 100 is held in the reset phase. The IC 100 is configured to operate in the debug mode of operation if the circuits are inappropriately initialized during the reset sequence and the debug circuit 101 debugs the IC 100 to identify the inappropriately initialized circuits.

The IC 100 further includes a pad control register 102, a pad configuration register 104, and an input/output (IO) pad 106.

The debug circuit 101 includes the first through fifth logic gates 108-116. In an embodiment of the present invention, the first logic gate 108 is an XNOR gate 108, the second and fourth logic gates 110 and 114 are AND gates 110 and 114, respectively, and the third and fifth logic gates 112 and 116 are OR gates 112 and 116, respectively. The XNOR gate 108 has a first input terminal connected to the circuit monitoring circuit such as a flash memory monitoring circuit for receiving the flash ready signal as a functional signal and a second input terminal for receiving a reference voltage signal, and an output terminal for outputting a functional control signal. The reference voltage signal may be generated by an internal bandgap reference voltage generator (not shown). When the IC 100 is in the debug mode, the XNOR gate 108 compares a logic state of the functional signal with that of the reference signal. The logic state of the reference signal corresponds to an incorrect logic state of the functional signal, i.e., a logic state that indicates incorrect initialization of the circuits, during the corresponding reset phase. The AND gate 110 has a first input terminal connected to the output terminal of the XNOR gate 108 for receiving the functional control signal, a second input terminal for receiving a debug control signal, and an output terminal for generating a second signal. A debug enable circuit (explained in conjunction with FIG. 2), generates the debug control signal in the debug mode of operation of the IC 100. The pad control register 102 stores pull-type select and pull-enable control bits and generates pull-enable control and pull-type select control signals. The OR gate 112 has a first input terminal connected to the output terminal of the AND gate 110 for receiving the second signal, a second input terminal connected to the pad control register 102 for receiving the pull-enable control signal, and an output terminal for generating a pull-enable signal. The AND gate 114 has a first input terminal for receiving the reference signal, a second input terminal for receiving the debug control signal, and an output terminal for generating a first signal. The OR gate 116 has a first input terminal connected to the output terminal of the AND gate 114 for receiving the first signal, a second input terminal connected to the pad control register 102 for receiving the pull-type select control signal, and an output terminal for generating a pull-type select signal.

The pad configuration register 104 is connected to the output terminals of the OR gates 112 and 116 for receiving the pull-type select and pull-enable signals and connected to the IO pad 106 for configuring the IO pad 106 in one of a logic high, logic low, and high impedance states.

The IO pad 106 includes pull-up and pull-down resistors 118*a* and 118*b*. A first terminal of the pull-up resistor 118*a* is connected to a supply voltage $V_{dd}$ and a second terminal thereof is connected to a first terminal of the pull-down resistor 118*b*. A second terminal of the pull-down resistor 118*b* is connected to ground. The pad control register 102 generates pull-enable and pull-type select control signals at logic low state during the reset phases of the reset sequence.

Figure 2:
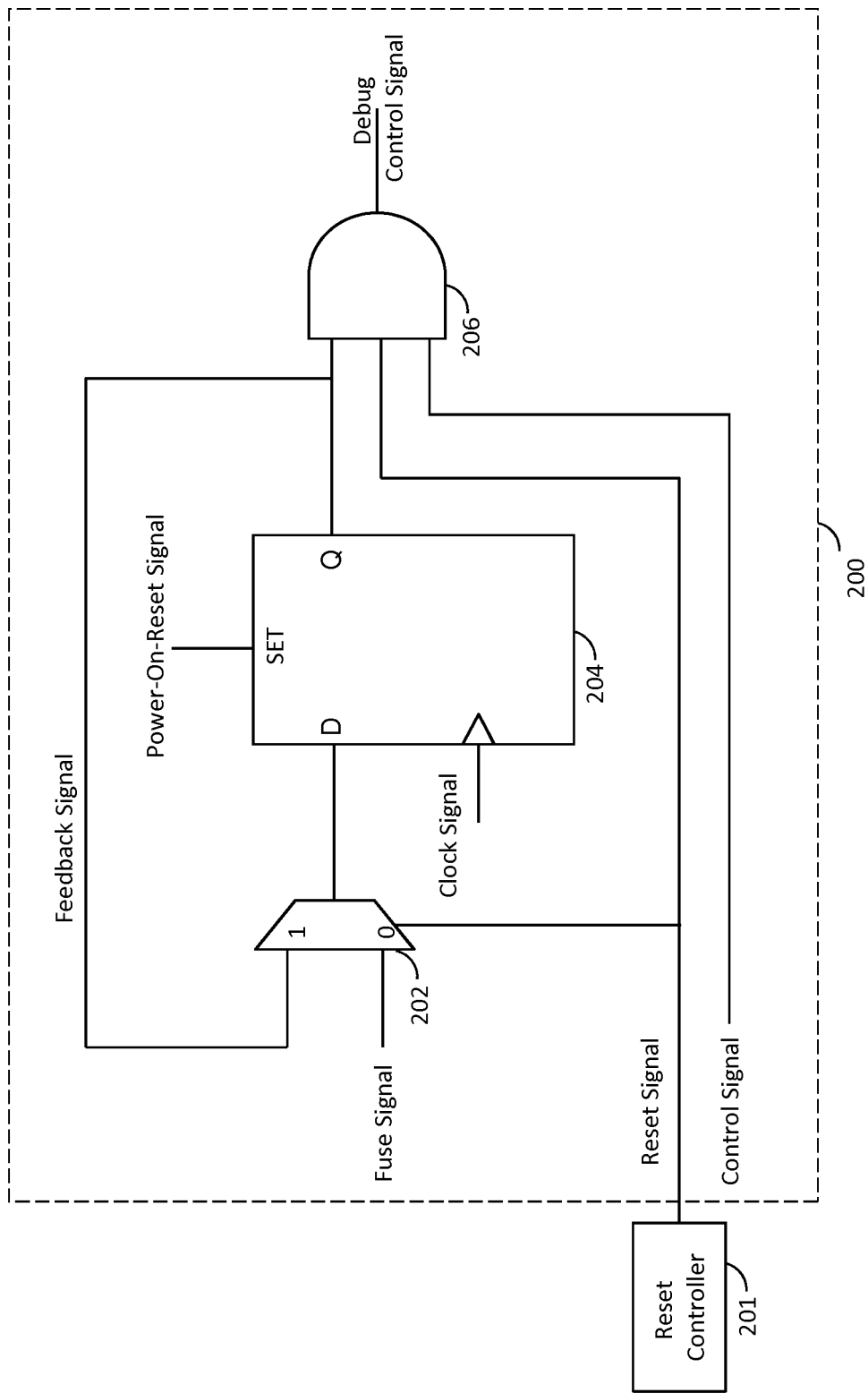
FIG. 2 is a schematic block diagram of a debug enable circuit for generating a debug control signal in accordance with an embodiment of the present invention.

Referring now to FIG. 2, a debug enable circuit 200 for generating the debug control signal connected to a reset controller 201 in accordance with an embodiment of the present invention is shown. The reset controller 201 generates a reset process complete signal after completion of the reset sequence. The reset controller 201 inverts the reset process complete signal to generate and provide a reset signal to the debug enable circuit 200. The IC 100 may include multiple such debug circuits 101 corresponding to multiple IO pads 106 of the IC 100. The debug enable circuit 200 is connected to the debug circuits 101. The debug enable circuit 200 includes a multiplexer 202 or mux 202, a flip-flop 204, and a logic gate 206. In an embodiment of the present invention, the mux 202 is a 2:1 mux and the logic gate 206 is an AND gate 206. The flip-flop 204 is a D-type positive-edge triggered flip-flop.

The mux 202 has a first input terminal connected to a fuse register (not shown) for receiving a fuse signal, a second input terminal for receiving a feedback signal, a select terminal connected to the reset controller 201 for receiving the reset signal, and an output terminal for outputting at least one of the fuse and feedback signals. When the IC 100 is in the debug mode, the fuse register stores a fuse bit that is at logic high state. The flip-flop 204 has a first input terminal connected to the output terminal of the mux 202 for receiving at least one of the fuse and feedback signals, a second input terminal connected to the POR generator (not shown) for receiving the POR signal, a clock input terminal for receiving a clock signal, and an output terminal for outputting at least one of the fuse and feedback signals. The output terminal of the flip-flop 204 is connected to the first input terminal of the mux 202. The AND gate 206 has a first input terminal connected to the output terminal of the flip-flop 204 for receiving at least one of the fuse and feedback signals, a second input terminal connected to the reset controller 201 for receiving the reset signal, a third input terminal for receiving a control signal, and an output terminal for generating the debug control signal.

Figure 3:
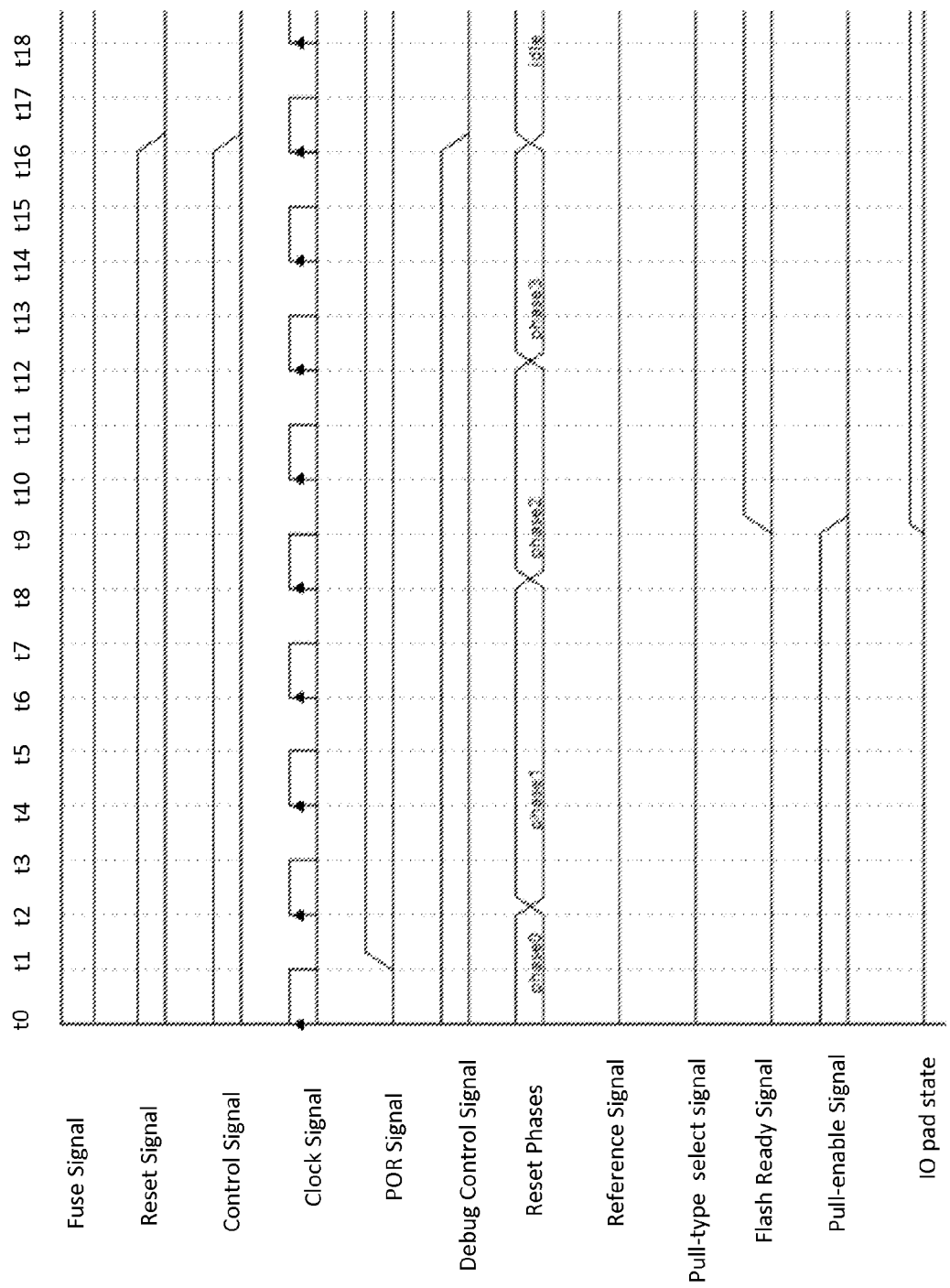
FIG. 3 is a timing diagram that illustrates various signals generated by the debug circuit and the debug enable circuit of FIGS. 1 and 2, respectively in accordance with an embodiment of the present invention.

Referring now to FIG. 3, a timing diagram illustrating the fuse signal, the reset signal, the control signal, the clock signal, the POR signal, the debug control signal, the reset phases of the reset sequence, the reference signal, the pull-type signal, the pull-enable signal, the flash ready signal, and the state of the IO pad 106 of the IC 100 is shown. Generally, when the IC 100 is powered up (at time instance t0), the functional signals are at logic low state. However, when the functional signals fail to change the logic state thereof in the subsequent reset phases, the IC 100 is held in the corresponding reset phase. In the example, the flash ready signal is desired to be at logic low state during the POR phase, i.e., the first reset phase, and the second reset phase (during time period t0-t9). The flash ready signal toggles from logic low to logic high state during the third reset phase (at time instance t9) and is at logic high state thereon during the reset phases 2 and 3 (time instance t9 to t16). When the flash ready signal is at logic low state during the second and third reset phases (time period t9-t16), the IC 100 is held in the reset sequence. Thus, the reference signal is set at logic low state, as shown in FIG. 3, to determine the logic state of the flash ready signal.

In operation, when the IC 100 is powered on, the POR generator generates the POR signal at logic low state and the IC 100 is in the first reset phase (during time period t0-t1). The flip-flop 204 is a set-type flip-flop and has an active low second input terminal. Thus, the second input terminal of the flip-flop 204 receives the POR signal at logic low state and the output terminal thereof provides a logic high signal to the first input terminal of the AND gate 206. The reset controller 201 generates the reset process complete signal to indicate the completion of the reset sequence. Subsequently, the reset controller 201 also generates the reset signal. When the IC 100 is in one of the reset phases of the reset sequence, the reset process complete signal is at logic low state and the reset signal is at logic high state (during time period t0-t16). When the reset sequence is complete, the reset process complete signal is at logic high state and the reset signal is at logic low state (during time period t16-t18).

When the IC 100 is in the first reset phase, the second input terminal of the AND gate 206 receives the reset signal at logic high state (during time period t0-t2). The third input terminal of the AND gate 206, is connected to a test enable IO pad (not shown) of the IC 100 and receives the control signal therefrom. The test enable IO pad is at logic high state and thus, the control signal is at logic high state (during time period t0-t16). A user may control the test enable IO pad. Thus, the control of debugging the IC 100 is available with the user. When the IC 100 is in the first reset phase, the third input terminal of the AND gate 206 receives the control signal at logic high state (during time period t0-t2). Thus, during the first reset phase, the AND gate 206 receives the logic high signal from the flip-flop 204, the logic high reset signal, and the logic high control signal and generates the debug control signal at logic high state (during time period t0-t2).

During the first reset phase (during time period t0-t2), when the flash ready and reference signals are at logic low states, the XNOR gate 108 generates the functional control signal at logic high state. The AND gate 110 receives the logic high functional control and debug control signals and generates the second signal at logic high state. The OR gate 112 receives the logic high second signal and logic low pull-enable control signal and generates the pull-enable signal at logic high state (at time instance t0). The AND gate 114 receives the logic high debug control signal and the logic low reference signal and generates the first signal at logic low state. The OR gate 112 receives the logic low first and pull-type select control signals and generates the pull-type select signal at logic low state (at time instance t0). The pad configuration register 104 receives the logic high pull-enable signal and logic low pull-type select signal and configures the IO pad 106 to a logic low state (during time period t0-t2). In the IO pad 106, the pull-down resistor 118b receives the logic high pull-enable signal and logic low pull-type select signal and weakly pulls down the IO pad 106 to ground. The logic low state of the IO pad 106 indicates that the flash ready signal is at logic low state. Although the IO pad 106 is in logic low state, the IC 100 is not held in the first reset phase, as logic low state is the desired logic state of the flash ready signal in the first reset phase.

After the completion of the first reset phase, the POR generator generates the POR signal at logic high state and the flip-flop 204 receives the logic high POR signal (at time instance t1). Thus the flip-flop 204 outputs at least one of the fuse and feedback signals. The mux 202 outputs the feedback signal based on the logic high reset signal (during time period t2-t16). The flip-flop 204 receives the feedback signal which is the logic high signal and provides the feedback signal to the first input terminal of the AND gate 206 (during time period t2-t16). During the first through fourth reset phases, the AND gate 206 receives the logic high reset and logic high control signals, and the logic high feedback signal from the flip-flop 204, and generates the debug control signal at logic high state (during time period t2-t16).

When the IC 100 transitions into the third reset phase, the non-volatile memories such as the flash memory are initialized and the flash ready signal toggles from logic low to logic high state (at time instance t9). The XNOR gate 108 receives the logic high flash ready and logic low reference signals (at time instance t9) and generates the functional control signal at logic low state. The AND gate 110 receives the logic low functional control signal and the logic high debug control signal and generates the second signal at logic low state. The OR gate 112 receives the logic low second and pull-enable control signals and generates the pull-enable signal at logic low state (at time instance t9). The AND gate 114 receives the logic high debug control signal and the logic low reference signal and generates the first signal at logic low state. The OR gate 116 receives the logic low first and pull-type select control signals and generates the pull-type select signal at logic low state (at time instance t9). As the pull-enable signal is at logic low state, the pad configuration register 104 configures the IO pad 106 in the high impedance state (at time instance t9). The high impedance state of the IO pad 106 indicates that the flash ready signal is at the desired logic state. However, when the flash ready signal fails to toggle from logic low to logic high state and is at logic low state in the second and third reset phases, the pad configuration register 104 configures the IO pad 106 to logic low state. The logic low state of the IO pad 106 during the second and third reset phases indicates an undesired logic state of the flash ready signal.

The first through fourth reset phases have corresponding predetermined time periods. When the IO pad 106 is in the logic low state for the first through fourth reset phases, i.e., for a time period greater than the predetermined time periods for the first and second reset phases, the IC 100 is held in the reset sequence. It will be apparent to those skilled in the art that the undesired logic state of some of the functional signals may be logic high state during the reset phases. The reference signal is then set to logic high state and the pad configuration register 104 configures the IO pad 106 in logic high state when the functional signal is in the undesired logic state.

After the completion of the reset sequence, the reset controller 201 generates the reset process complete signal at logic high state and hence, the reset signal is at logic low state (during time instance t16-t18). The mux 202 outputs the fuse signal based on the logic low reset signal. The flip-flop 204 receives the fuse signal and provides the fuse signal to the first input terminal of the AND gate 206. However, as the reset signal at the second input terminal of the AND gate 206 is at logic low state, the debug control signal is at logic low state and the debug circuit 101 is disabled (during time period t16-t18). For the subsequent reset sequence, the fuse signal determines the logic state of the debug control signal. When the IC 100 transitions into any of the subsequent reset sequences, the reset controller 201 generates the reset process complete signal at logic low state and the reset signal is at logic high state (during time period t2-t16). When the fuse signal is at logic high state, consequently, the feedback signal is at logic high state. The mux 202 outputs the feedback signal based on the logic high reset signal. The flip-flop 204 receives the logic high feedback signal and provides the logic high feedback signal to the first input terminal of the AND gate 206. The AND gate 206 receives the logic high reset and control signals and generates the debug control signal at logic high state (during time period t2-t16). The debug enable circuit 200 provides an option to the user to disable the debug circuit 101 by way of the test enable IO pad. In an alternate embodiment of the present invention, the AND gate 206 has the first and second input terminals for receiving at least one of the fuse and feedback signals and the reset signal, respectively, and an output terminal for generating the debug control signal based on either of the fuse or feedback signals and the reset signal.

As the IC 100 is debugged during the reset sequence by determining a logic state of the IO pad 106, the IO pad 106 does not require additional redesigning for debugging. Further, absence of additional dedicated debugging IO pads restrains any increase in the area and cost of the IC 100. As the debug circuit 101 is a standard circuit and different functional signals require only the logic state of the reference signal to be altered, the implementation of the debug mode in the IC 100 is simple. The number of IO pads 106 that are connected to a corresponding debug circuit 101 is based on the number of the functional signals that need to be observed. If the IO pad 106 is connected to an IO pad of an external IC and the debug circuit 101 controls the IO pad 106 when the IC 100 is in the debug mode, contention is avoided as the pull-up and pull-down resistors 118a and 118b weakly pull up and pull down the IO pad 106, respectively. When the IC 100 is in the functional mode, the debug enable circuit 200 disables the debug circuit 101 and hence, the IO pad 106 is inaccessible by the debug circuit 101. Thus, the external IC can control the IO pad 106 without any contention in both the debug and functional modes, ensuring smooth and error-free communication between the IC 100 and the external IC.

It will be understood by those of skill in the art that the same logical function may be performed by different arrangements of logic gates, or that logic circuits operate using either positive or negative logic signals. Therefore, variations in the arrangement of some of the logic gates described above should not be considered to depart from the scope of the present invention.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. An integrated circuit operable in functional and debug modes and having an input/output (IO) pad, comprising:
   a pad control register for storing pull-type select control and pull-enable control bits and generating pull-type select control and pull-enable control signals when the integrated circuit is in the functional mode;
   a first logic gate having a first input terminal for receiving a debug control signal, a second input terminal for receiving a reference signal, and an output terminal for generating a first signal when the integrated circuit is in the debug mode;
   a second logic gate having a first input terminal connected to the output terminal of the first logic gate for receiving the first signal, a second input terminal connected to the pad control register for receiving the pull-type select control signal, and an output terminal for generating the first signal as a pull-type select signal when the integrated circuit is in the debug mode;
   a third logic gate having a first input terminal for receiving a functional signal of the integrated circuit, a second input terminal for receiving the reference signal, and an output terminal for generating a functional control signal when the integrated circuit is in the debug mode;
   a fourth logic gate having a first input terminal for receiving the debug control signal, a second input terminal connected to the output terminal of the third logic gate for receiving the functional control signal, and an output terminal for generating a second signal when the integrated circuit is in the debug mode;
   a fifth logic gate having a first input terminal connected to the output terminal of the fourth logic gate for receiving the second signal, a second input terminal connected to the pad control register for receiving the pull-enable control signal, and an output terminal for generating the second signal as a pull-enable signal when the integrated circuit is in the debug mode; and
   a pad configuration register, connected to the output terminals of the second and fifth logic gates for receiving the corresponding pull-type select and pull-enable signals, and to the IO pad for configuring the IO pad in at least one of logic high, logic low, and high impedance states when the integrated circuit is in the debug mode, wherein at least one of the logic high, logic low, and high impedance states of the IO pad indicates a state of the functional signal of the integrated circuit.

2. The integrated circuit of claim 1, further comprising:
   a multiplexer having a first input terminal for receiving a feedback signal, a second input terminal for receiving a fuse signal, a select terminal for receiving a reset signal, and an output terminal for outputting at least one of the feedback and fuse signals when the integrated circuit is in the debug mode;
   a flip-flop having a first input terminal connected to the output terminal of the multiplexer for receiving at least one of the feedback and fuse signals, a second input terminal for receiving a power-on-reset signal, a clock input terminal for receiving a clock signal, and an output terminal for outputting at least one of the feedback and fuse signals when the integrated circuit is in the debug mode, wherein the output terminal of the flip-flop is connected to the first input terminal of the multiplexer; and
   a sixth logic gate having a first input terminal connected to the output terminal of the flip-flop for receiving at least one of the feedback and fuse signals therefrom, a second input terminal for receiving the reset signal, a third input terminal for receiving a control signal, and an output terminal for generating the debug control signal when at least one of the feedback, fuse, reset, and control signals is at a logic high state and the integrated circuit is in the debug mode.

3. The integrated circuit of claim 2, wherein the first, second, third, fourth, fifth, and sixth logic gates each comprises at least one of an AND gate, an OR gate, and an XNOR gate.

4. The integrated circuit of claim 1, wherein the state of the functional signal is an incorrect state when the IO pad is either in a logic high state for a time period greater than a predetermined time period and a logic low state for a time period greater than the predetermined time period.

5. The integrated circuit of claim 1, wherein the pad configuration register places the IO pad in a logic high state when the pull-type select and pull-enable signals are at a logic high state, wherein the logic high state of the IO pad indicates that the functional signal is in a logic high state.

6. The integrated circuit of claim 1, wherein the pad configuration register places the IO pad in a logic low state when the pull-type select and pull-enable signals are in logic low and high states, respectively, wherein a logic low state of the IO pad indicates that the functional signal is in a logic low state.

7. The integrated circuit of claim 1, wherein the pad configuration register configures the IO pad in a high impedance state when the pull-enable signal is in a logic low state, wherein the high impedance state of the IO pad indicates a correct state of the functional signal.

8. The integrated circuit of claim 1, wherein the IO pad includes:
a pull-up resistor having a first terminal connected to a supply voltage; and
a pull-down resistor having a first terminal connected to a second terminal of the pull-up resistor and a second terminal connected to ground.

9. The integrated circuit of claim 8, wherein the pad configuration register configures the IO pad such that the pull-up resistor pulls up a voltage of the IO pad to the supply voltage, thereby placing the IO pad in a logic high state, and the pull-down resistor pulls down a voltage of the IO pad to ground, thereby placing the IO pad in a logic low state when the integrated circuit is in the debug mode.

10. The integrated circuit of claim 1, wherein the debug mode corresponds to a reset sequence of the integrated circuit.

11. An integrated circuit operable in functional and debug modes and having an input/output (IO) pad, comprising:
a multiplexer having a first input terminal for receiving a feedback signal, a second input terminal for receiving a fuse signal, a select terminal for receiving a reset signal, and an output terminal for outputting at least one of the feedback and fuse signals when the integrated circuit is in the debug mode;
a flip-flop having a first input terminal connected to the output terminal of the multiplexer for receiving at least one of the feedback and fuse signals, a second input terminal for receiving a power-on-reset signal, a clock input terminal for receiving a clock signal, and an output terminal for outputting at least one of the feedback and fuse signals when the integrated circuit is in the debug mode, wherein the output terminal of the flip-flop is connected to the first input terminal of the multiplexer;
a first logic gate having a first input terminal connected to the output terminal of the flip-flop for receiving at least one of the feedback and fuse signals, a second input terminal for receiving the reset signal, a third input terminal for receiving a control signal, and an output terminal for generating a debug control signal when at least one of the feedback, fuse, reset, and control signals is at logic high state and the integrated circuit is in the debug mode;
a pad control register for storing pull-type select control and pull-enable control bits and generating pull-type select control and pull-enable control signals when the integrated circuit is in the functional mode;
a second logic gate having a first input terminal connected to the output terminal of the first logic gate for receiving the debug control signal, a second input terminal for receiving a reference signal, and an output terminal for generating a first signal when the integrated circuit is in the debug mode;
a third logic gate having a first input terminal connected to the output terminal of the second logic gate for receiving the first signal, a second input terminal connected to the pad control register for receiving the pull-type select control signal, and an output terminal for outputting the first signal as a pull-type select signal when the integrated circuit is in the debug mode;
a fourth logic gate having a first input terminal for receiving a functional signal of the integrated circuit, a second input terminal for receiving the reference signal, and an output terminal for generating a functional control signal when the integrated circuit is in the debug mode;
a fifth logic gate having a first input terminal for receiving the debug control signal, a second input terminal connected to the output terminal of the fourth logic gate for receiving the functional control signal, and an output terminal for generating a second signal when the integrated circuit is in the debug mode;
a sixth logic gate having a first input terminal connected to the output terminal of the fifth logic gate for receiving the second signal, a second input terminal connected to the pad control register for receiving the pull-enable control signal, and an output terminal for generating the second signal as a pull-enable signal when the integrated circuit is in the debug mode; and
a pad configuration register, connected to the output terminals of the third and sixth logic gates for receiving the corresponding pull-type select and pull-enable signals and the IO pad for configuring the IO pad in at least one of logic high, logic low, and high impedance states when the integrated circuit is in the debug mode, whereby at least one of the logic high, logic low, and high impedance states of the IO pad indicate a state of the functional signal of the integrated circuit.

12. The integrated circuit of claim 11, wherein the state of the functional signal is an incorrect state when the IO pad is in at least one of logic high state for a time period greater than a predetermined time period and logic low state for a time period greater than the predetermined time period.

13. The integrated circuit of claim 11, wherein the pad configuration register configures the IO pad in logic high state when the pull-type select and pull-enable signals are at logic high state, whereby logic high state of the IO pad indicates that the functional signal of the integrated circuit is at logic high state.

14. The integrated circuit of claim 11, wherein the pad configuration register configures the IO pad in logic low state when the pull-type select and pull-enable signals are at logic low and high states, respectively, whereby logic low state of the IO pad indicates that the functional signal of the integrated circuit is at logic low state.

15. The integrated circuit of claim 11, wherein the pad configuration register configures the IO pad in high impedance state when the pull-enable signal is at logic low state, whereby high impedance state of the IO pad indicates a correct state of the functional signal of the integrated circuit.

16. The integrated circuit of claim 11, wherein the first, second, third, fourth, fifth, and sixth logic gates each comprises at least one of an AND gate, an OR gate, an XOR gate, a NOT gate, and an XNOR gate.

17. The integrated circuit of claim 11, wherein the IO pad includes:
a pull-up resistor having a first terminal connected to a supply voltage, and
a pull-down resistor having a first terminal, connected to a second terminal of the pull-up resistor and a second terminal connected to ground.

18. The integrated circuit of claim 17, wherein the pad configuration register configures the IO pad such that the pull-up resistor pulls up a voltage of the IO pad to the supply voltage, thereby configuring the IO pad in logic high state, and the pull-down resistor pulls down a voltage of the IO pad to ground, thereby configuring the IO pad in logic low state when the integrated circuit is in the debug mode.

19. The integrated circuit of claim 11, wherein the multiplexer outputs the feedback signal at logic high state when the power-on-reset signal is at logic low state and the reset signal is at logic high state.

20. The integrated circuit of claim 11, wherein the functional signal of the integrated circuit comprises at least one of a clock initialization status signal and a memory initialization status signal.

* * * * *